United States Patent
Kim

(10) Patent No.: US 7,244,668 B2
(45) Date of Patent: Jul. 17, 2007

(54) METHODS OF MANUFACTURING SEMICONDUCTOR DEVICES

(75) Inventor: Duk Soo Kim, Gwangju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,954

(22) Filed: Dec. 30, 2004

(65) Prior Publication Data
US 2005/0272262 A1    Dec. 8, 2005

(30) Foreign Application Priority Data
Jun. 7, 2004 (KR) .................. 10-2004-0041324

(51) Int. Cl.
*H01L 21/20* (2006.01)
*H01L 21/44* (2006.01)
(52) U.S. Cl. .................. 438/503; 438/509; 438/655; 438/656; 438/682
(58) Field of Classification Search .............. 438/478, 438/503, 509, 655, 656, 682
See application file for complete search history.

(56) References Cited

U.S. PATENT DOCUMENTS

| 5,841,173 A * | 11/1998 | Yamashita ............... 257/384 |
| 6,524,952 B1 * | 2/2003 | Srinivas et al. ............ 438/649 |
| 6,984,591 B1 * | 1/2006 | Buchanan et al. ......... 438/778 |
| 2002/0115289 A1 * | 8/2002 | Wu ............................ 438/664 |
| 2004/0180543 A1 * | 9/2004 | Lee et al. .................. 438/683 |

* cited by examiner

Primary Examiner—Hsien-Ming Lee
(74) Attorney, Agent, or Firm—Andrew D. Fortney

(57) ABSTRACT

Methods for manufacturing semiconductor devices are disclosed. In one example, the semiconductor device has a gate and source/drain regions formed on a substrate. One example method includes introducing transition metal (Ti) source or precursor so that the introduced Ti source is chemisorbed onto the surface of the substrate and Ti mono-layer is formed; introducing semiconductor (Si) source so that the introduced Si source is chemisorbed onto the Ti mono-layer and Si mono-layer is formed; repeating the forming of the Ti and Si mono-layers; annealing the substrate to form a silicide layer ($TiSi_2$) of C-54 phase; and patterning the C-54 phase $TiSi_2$ layer to remain on the upper surfaces of the gate and source/drain regions.

19 Claims, 5 Drawing Sheets

METHODS OF MANUFACTURING SEMICONDUCTOR DEVICES

TECHNICAL FIELD

The present disclosure relates to semiconductor devices and, more particularly, to methods of manufacturing semiconductor device.

BACKGROUND

As the speed and information capacity of semiconductor devices continue to improve, silicide layers formed on the gate or source/drain contact regions are widely used to prevent the decrease of devices operational speed due to the increase of gate resistance and contact resistance of source/drain contact.

Conventionally, the silicide layer is formed by a so-called salicide process (self-aligned silicide), where silicide reaction is occurred selectively on the upper region of gate or source/drain contact without using additional photo-mask. Titanium (Ti), cobalt (Co), tungsten (W) and nickel (Ni) metals are used for the silicide metal.

With reference to FIGS. 1a to 1c, conventional method for forming the silicide layer in semiconductor device is explained.

Referring to FIG. 1a, an isolation layer 11 is formed in a semiconductor substrate 10 including silicon (Si) by using a known shallow trench isolation (STI) technology. On the substrate 10 with the isolation layer 11 are sequentially formed a gate oxide 12 and polysilicon gate 13.

With the gate 13 being mask, Lightly Doped Drain (LDD) ion implantation into the substrate 10 is carried out, and then spacers 14 made of oxide or nitride are formed at both sides of the gate 13. Then highly doped impurity ion is implanted to the substrate 10 by using the spacers 14 as an implantation mask to form source/drain region of the LDD structure.

Relatively thin Ti and TiN layers are sequentially deposited on the substrate 10 by a sputtering method to form Ti/TiN layer 16, which covers the gate 13 and spacers 14. The purpose of additionally forming TiN layer on the Ti layer is to prevent oxidation of the surface of the Ti layer during subsequent thermal treatment processes.

Referring to FIG. 1b, by carrying out a first thermal treatment process in $N_2$ environment and using 750° C. temperature for 30 seconds, Ti on the Ti/TiN layer 16 is made to react with Si of the source/drain contact region 15 and gate 13 to form titanium silicide ($TiSi_2$) layer 17a of C-49 phase on the contact region 15 and gate 13, respectively. The $TiSi_2$ layer 17a of C-49 phase has resistivity of 90 μcm.

Referring to FIG. 1c, the unreacted Ti/TiN layer 16 is removed by a wet etching method using $H_2SO_4/H_2O_2$ compound and a second thermal treatment process of $N_2$ environment is performed at 825° C. temperature for 20 seconds to transform the C-49 phase $TiSi_2$ layer 17a to a thermodynamically stable C-54 phase $TiSi_2$ layer 17b, which has lower resistivity of 16 to 20 μcm than the C-49 $TiSi_2$ layer 17a.

As explained above, in the conventional method, two thermal treatment processes have to be performed for obtaining the stable C-54 $TiSi_2$ layer 17b. Further, for completely removing the unreacted Ti/TiN layer 16 after the first thermal treatment process, the wet etching should be done overly and thus the substrate can be damaged by chemicals used in the wet etching process.

DETAILED DESCRIPTION

Disclosed herein are methods of forming a silicide layer in semiconductor devices.

Figure 1A:
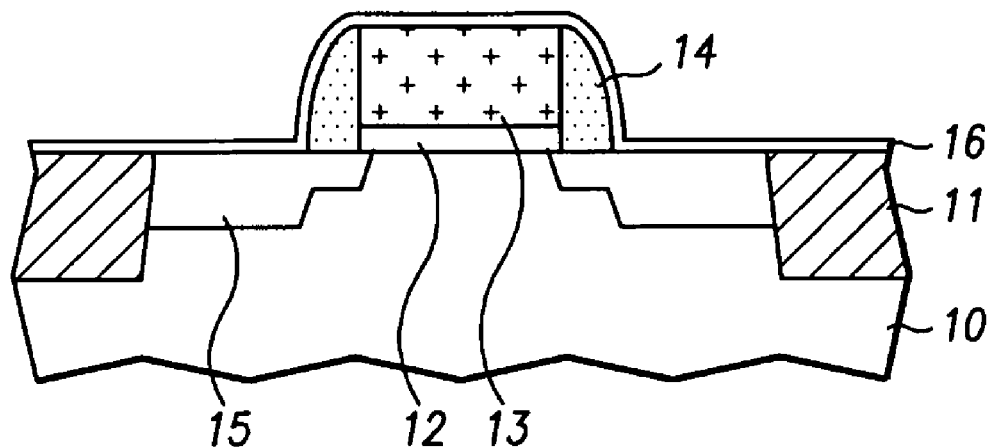
FIGS. 1a to 1c are cross sectional views for illustrating the conventional method for forming a silicide layer in semiconductor devices.
Figure 1B:
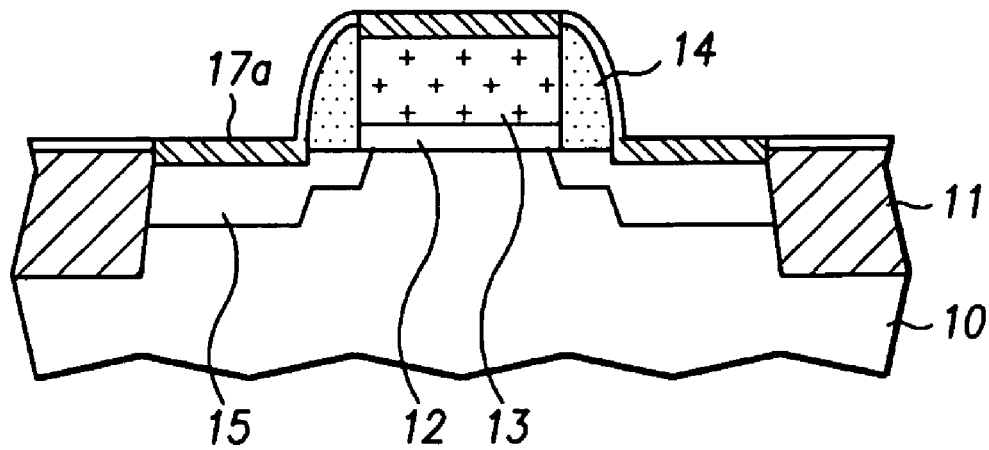
Figure 1C:
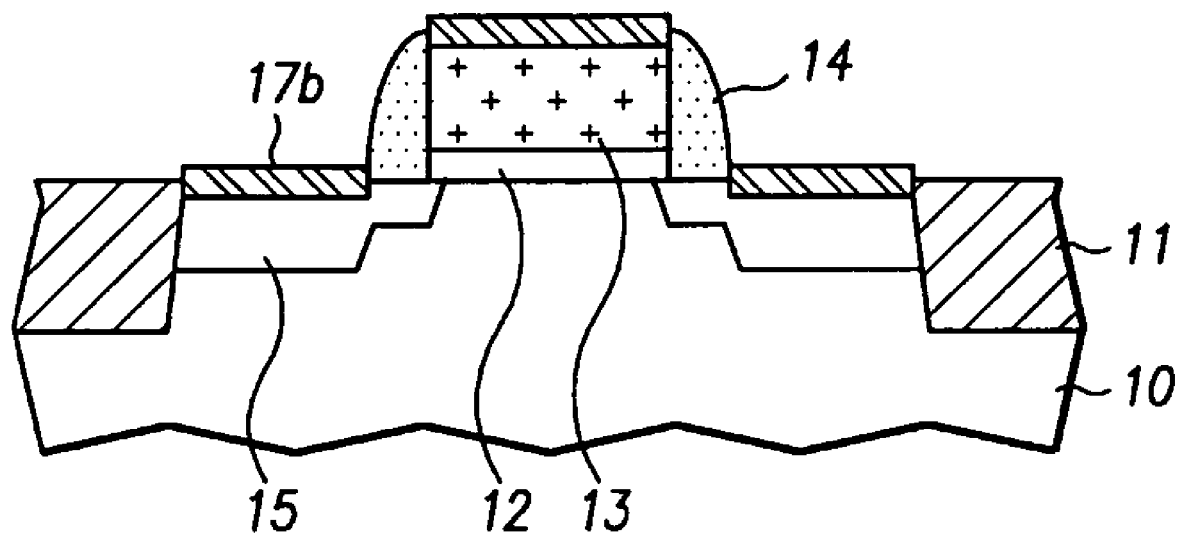
Figure 2A:
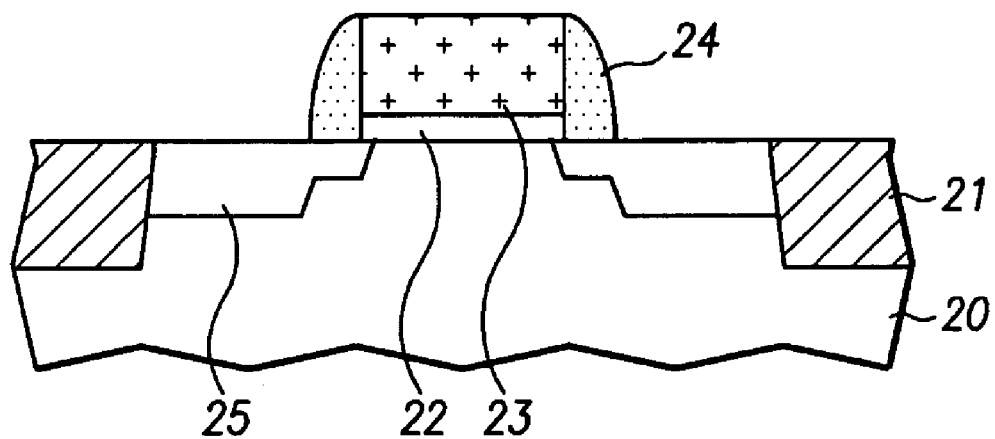
FIGS. 2a to 2d are cross sectional views of semiconductor devices at various stages of fabrication according to the disclosed methods.
Figure 2B:
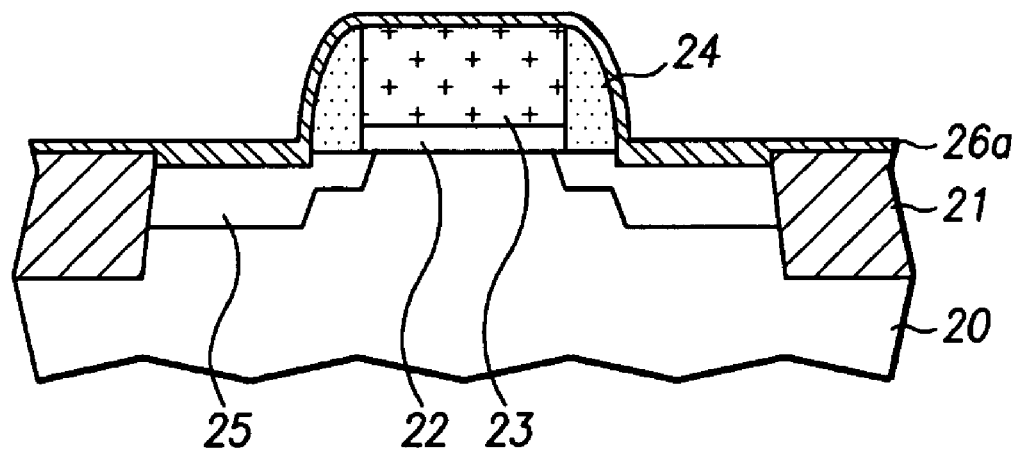

Referring to FIG. 2a, an isolation layer 21 is formed by, for example, a conventional Shallow Trench Isolation (STI) technique in a semiconductor substrate 20 including a silicon substrate. In an active region defined by the STI isolation 21, a gate oxide 22 and gate electrode 23 are sequentially deposited and patterned on the substrate 20. The gate electrode 23 may be made of polysilicon.

By using the polysilicon gate electrode 23 as a masking layer, a shallow, lightly doped source and drain regions are formed by an implantation. Then an oxide layer is deposited by for example a Chemical Vapor Deposition (CVD) process and removed by, for example, Reactive Ion Etching (RIE), leaving only the sidewall spacers 24 on each side of the gate electrode 23. The sidewall spacers 24 serve as a mask for the second implant, which forms heavily doped source and drain regions 25 separated from the channel region by the small lightly doped extension.

As disclosed herein, $TiSi_2$ layers 26 are formed by Atomic Layer Deposition (ALD)) on the substrate 20 to cover the gate electrode 23 and the sidewall spacers 24. The $TiSi_2$ layer 26 of C-54 phase has a thickness ranging from about 200 Å to about 300 Å. ALD is a CVD related chemical thin film deposition method, which relies on sequential saturative surface reactions. The gaseous precursors or sources are alternatively introduced onto the substrates. Between the reactant pulses the reactor is either purged with an inert carrier gas as in flow-type reactors or evacuated. Under properly adjusted experimental conditions, i.e., deposition temperature, reactant dose and length of precursor and purge pulses, a chemisorbed monolayer of the first reactant is left on the surface after the purge sequence. The $TiSi_2$ layer is formed by the ALD, the process of which is described below.

Figure 3:
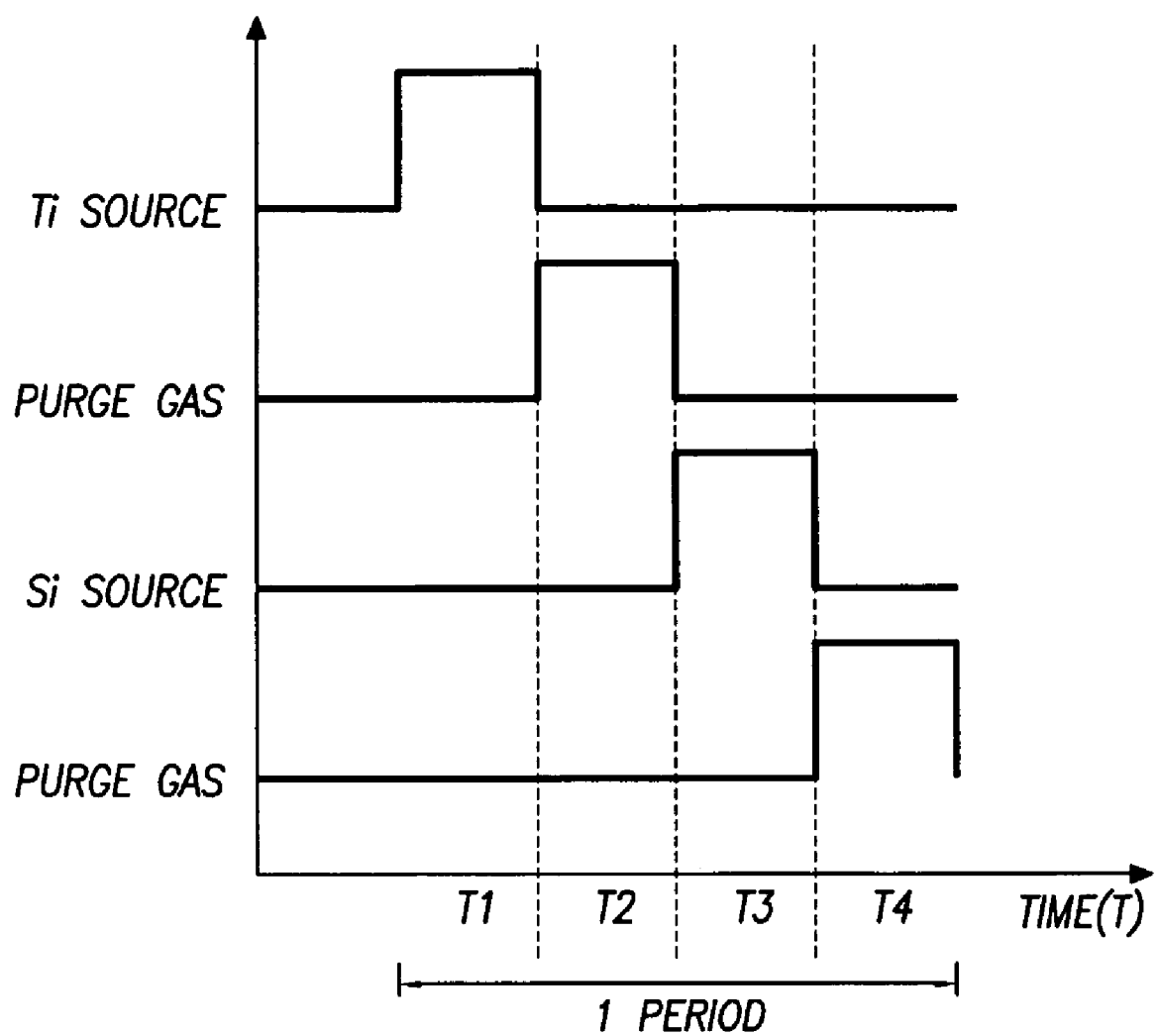
FIG. 3 is a graph for explaining the process of forming a silicide layer by Atomic Layer Deposition (ALD) disclosed methods.

A semiconductor substrate is loaded into a deposition chamber (not shown) (S1). While maintaining the temperature of substrate to be about 400° C. to 800° C., Ti source or precursor is introduced into the deposition chamber during time T1 as shown in FIG. 3. This is performed so that the Ti source is chemisorbed onto the surface of the substrate. In one example, the Ti source includes $TiCl_4$, $TiBr_4$, $TiI_4$, and $TiF_4$.

Then, purge gas is provided into the deposition chamber during time T2 as shown in FIG. 3 to remove byproduct from the chamber. The purge gas may be an inert gas such as Ar and $N_2$.

The above forms a Ti mono-layer, which reacts with silicon of the substrate to form TiSi. The thickness of the Ti mono-layer is, for example, about 5 Å to about 10 Å.

An Si source is introduced into the chamber during time T3 as shown in FIG. 3 so that the surface of substrate reacts with and chemisorbs the Si source (S2). TiSi on the substrate reacts with Si and forms $TiSi_2$. The Si may include $SiH_4$, $SiH_2Cl_2$, $CH_3SiCl_3$, $(CH_3)_2SiCl_2$, and $(CH_3)_3SiCl$. Thus, when the transition metal comprises titanium (Ti) and the semiconductor comprises silicon (Si), in forming the semiconductor mono-layer, a $TiSi_2$ layer of C-49 phase is formed by reaction of TiSi on the surface of the substrate and the introduced Si-source.

Subsequently, a purge gas is provided into the deposition chamber during time T4 as shown in FIG. 4 to remove byproduct from the chamber. Similar to S1, inert gas such as Ar and $N_2$ can be used as the purge gas.

The process conducted during time T3 and T4 results in an Si mono-layer. According to one example, this process is performed twice to make the thickness of the Si mono-layer to be about 10 Å to about 20 Å.

The formation processes of the Ti mono-layer and Si mono-layer is repeated when a predetermined thickness of intended salicide is obtained (S3). For instance, for a 300 Å layer of salicide to be formed on the gate or contact regions, the processes for the Ti mono-layer and Si mono-layer may be repeated 20 to 30 times.

After the repetition of the mono-layer formation processes, the substrate is annealed to make the salicide in C-54 phase (S4). In one example, the annealing is performed at a temperature ranged from about 800° C. to about 900° C.

Figure 2C:
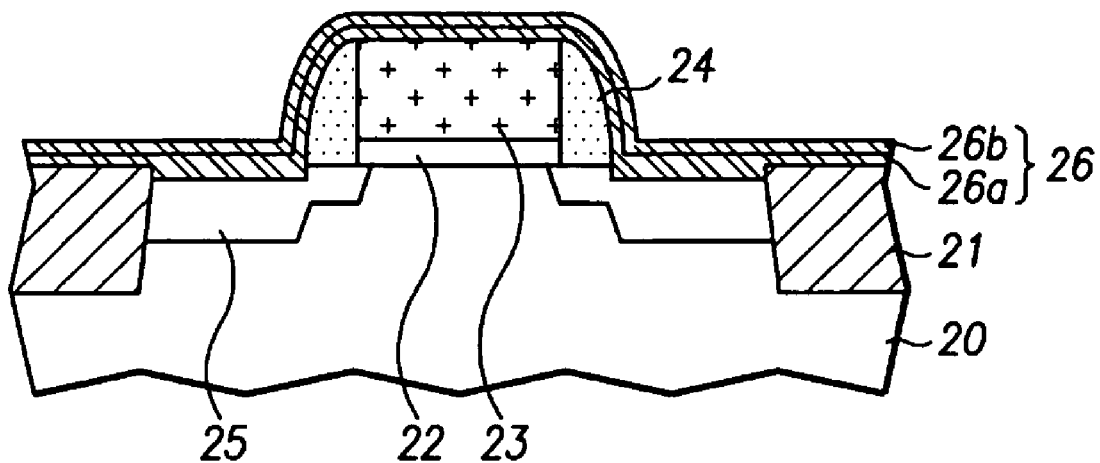

The process described above in conjunction with S1 to S3 may constitute one process cycle and this cycle may be iterated to form multi $TiSi_2$ layers 26a and 26b as shown in FIG. 2C.

Figure 2D:
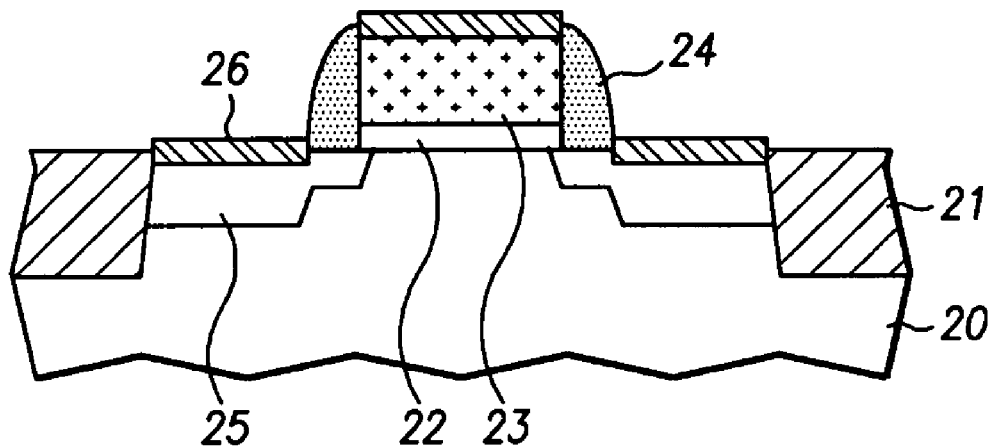

Referring to FIG. 2d, a mask pattern (not shown) is formed by a photolithography method to mask the $TiSi_2$ layer 26 on the gate 23 and source/drain regions 25. With this mask pattern, the exposed $TiSi_2$ layer 26 is dry-etched to make the $TiSi_2$ layer 26 remain on the upper surface of the gate 23 and source/drain regions 25. In this process, the isolation layer 21 and the spacers 24 act as etch stop layer and therefore there is no damage to the surface of the substrate.

In the above explanation, titanium (Ti) is employed as a silicide metal, cobalt (Co), tungsten (W) and nickel (Ni) can substitute the titanium metal.

As disclosed herein, a silicide such as $TiSi_2$ layer is formed by ALD with a Ti source and an Si source and the silicide layer is patterned by photolithography and dry etch processes to be formed on the upper surfaces of the gate and source/drain regions. Therefore, the processes and structures disclosed herein can provide a stable C-54 silicide layer of low resistivity without need to perform an additional heat treatment process and it is possible to make simple the silicide formation process.

Additionally, as disclosed herein, the silicide layer is formed only in an intended region by a dry etch, which results in the prevention of the damage of substrate and improvements of reliability and yield of the semiconductor IC devices.

The above discloses processes and structures to provide a method for forming a stable silicide or salicide layer while preventing the damage of substrate. A C-54 $TiSi_2$ layer may be provided without additional heat treatment process. Disclosed herein are processes for forming a silicide layer and improving the reliability and yield of semiconductor IC devices employing the silicide or salicide layer.

One example disclosed method of manufacturing a semiconductor device having a gate and source/drain regions formed on a substrate includes first introducing transition metal (Ti) source or precursor so that the introduced Ti source is chemisorbed onto the surface of the substrate and Ti mono-layer is formed; second introducing semiconductor (Si) source so that the introduced Si source is chemisorbed onto the Ti mono-layer and Si mono-layer is formed; repeating the forming the Ti and Si mono-layers; annealing the substrate to form a silicide layer ($TiSi_2$) of C-54 phase; and patterning the C-54 phase $TiSi_2$ layer to remain on the upper surfaces of the gate and source/drain regions.

In one example, the Ti source includes $TiCl_4$, $TiBr_4$, $TiI_4$, and $TiF_4$. The Si source may include $SiH_4$, $SiH_2Cl_2$, $CH_3SiCl_3$, $(CH_3)_2SiCl_2$, and $(CH_3)_3SiCl$. The annealing may be performed at a temperature ranged from about 800° C. to about 900° C., and the silicide layer formed may have a thickness of about 200 Å to about 300 Å.

It is noted that this patent claims priority from Korean Patent Application Serial Number 10-2004-0041324, which was filed on Jun. 7, 2004, and is hereby incorporated by reference in its entirety.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of manufacturing a semiconductor device, the method comprising:
    forming a gate and source/drain regions on a semiconductor substrate, spacers at both sides of the gate, and isolation layers defining the source/drain regions;
    chemisorbing a transition metal source onto a surface of the substrate and forming a transition metal mono-layer on the gate and source/drain regions;
    chemisorbing a semiconductor source onto the transition metal mono-layer and forming a semiconductor mono-layer;
    repeating the formation of the transition metal mono-layer and the semiconductor mono-layer;
    annealing the substrate to form a C-54 phase silicide layer; and
    patterning the C-54 phase silicide layer to remain on the upper surfaces of the gate and source/drain regions, wherein the patterning includes forming a mask pattern by photolithography to mask the silicide layer on the gate and source/drain regions and dry etching the silicide layer using the spacers and the isolation layers as an etch stop layer.

2. A method as defined by claim 1, wherein the transition metal mono-layer comprises a metal selected from the group consisting of titanium (Ti), cobalt (Ca), tungsten (W) and nickel (Ni), and the semiconductor mono-layer comprises silicon (Si).

3. A method as defined by claim 1, wherein the transition metal mono-layer comprises titanium (Ti), and the semiconductor mono-layer comprises silicon (Si).

4. A method as defined by claim 3 further including:
    providing purge gas for removing byproduct produced in forming the transitional metal mono-layer; and
    providing purge gas for removing byproduct produced in forming the semiconductor mono-layer.

5. A method as defined by claim 4, wherein the purge gas is inert gas selected from the group consisting of Ar and $N_2$.

6. A method as defined by claim 3, further comprising forming subsequent $TiSi_2$ layers, comprising the steps of:
    forming a bottom Si mono-layer on a preceding $TiSi_2$ layer;

forming a subsequent TiSi layer by reaction of the bottom Si mono-layer with a subsequent Ti mono-layer; and forming a subsequent $TiSi_2$ layer by reaction of the subsequent TiSi layer with a top Si mono-layer.

7. A method as defined by claim 3, further comprising forming a first TiSi layer by reaction of silicon on an upper surface of the semiconductor substrate and the transition metal mono-layer comprising Ti, and Conning a first $TiSi_2$ layer of C-49 phase by reaction of the first TiSi layer and the semiconductor mono-layer comprising Si.

8. A method as defined by claim 1, wherein the transition metal source comprises a gas selected from the group consisting of $TiCl_4$, $TiBr_4$, $TiI_4$ and $TiF_4$.

9. A method as defined by claim 1, wherein the semiconductor source comprises a gas selected from the group consisting of $SiH_4$, $SiH_2Cl_2$, $CH_3SiCl_3$, $(CH_3)_2SiCl_2$, and $(CH_3)_3SiCl$.

10. A method as defined by claim 1, wherein the annealing is performed at a temperature of from about 800° C. to about 900° C.

11. A method as defined by claim 1, wherein the silicide layer has a thickness of from about 200 Å to about 300 Å.

12. A method as defined by claim 1, wherein the transition metal source comprises a gas selected from the group consisting of $TiCl_4$ and $TiF_4$.

13. A method as defined by claim 1, wherein the semiconductor source comprises a gas selected from the group consisting of $SiH_4$ and $SiH_2Cl_2$.

14. A method defined by claim 1, wherein:

the step of chemisorbing the transition metal source comprises introducing the transition metal source into an atomic layer deposition (ALD) chamber;

the step of chemisorbing the semiconductor source comprises introducing the semiconductor source into the ALD chamber.

15. A method as defined by claim 14, said method further comprising:

introducing a purge gas for removing byproduct produced in forming the transition metal mono-layer into the ALD chamber; and introducing a purge gas for removing byproduct produced in forming the semiconductor mono-layer into the ALD chamber.

16. A method as defined by claim 15, wherein the purge gas comprises inert gas selected from the group consisting of Ar and $N_2$.

17. A method as defined by claim 1, wherein the transition metal mono-layer comprises cobalt (Co).

18. The method as defined by claim 1, wherein in the step of patterning the C-54 phase silicide layer, the spacers and isolation layers prevent damage to the substrate.

19. A method as defined by claim 1, further comprising chemisorbing a second semiconductor source onto the semiconductor mono-layer or a reaction product thereof, and forming a second semiconductor mono-layer.

* * * * *